(12) United States Patent
Gruson et al.

(10) Patent No.: US 8,493,058 B2
(45) Date of Patent: Jul. 23, 2013

(54) CIRCUIT ARRANGEMENT FOR FREQUENCY DETERMINATION

(75) Inventors: Frank Gruson, Lindau (DE); Paul Schnebli, Ravensburg-Oberzell (DE)

(73) Assignee: Conti Temic microelectronic GmbH (DE)

( * ) Notice: Subject to any disclaimer, the term of this patent is extended or adjusted under 35 U.S.C. 154(b) by 341 days.

(21) Appl. No.: 13/034,856

(22) Filed: Feb. 25, 2011

(65) Prior Publication Data

US 2012/0217952 A1 Aug. 30, 2012

(51) Int. Cl.
*G01R 23/00* (2006.01)
*G01R 23/02* (2006.01)

(52) U.S. Cl.
USPC .......... 324/76.52; 324/76.39; 331/46

(58) Field of Classification Search
USPC .......... 324/76.39, 76.11, 76.19, 76.24, 76.52, 324/76.53, 76.58, 605; 331/16, 18, 46, 47, 331/48, 51
See application file for complete search history.

(56) References Cited

U.S. PATENT DOCUMENTS

| | | | | | |
|---|---|---|---|---|---|
| 3,778,160 | A | * | 12/1973 | Wolcott | 356/5.11 |
| 4,153,884 | A | * | 5/1979 | Ikeguchi et al. | 331/1 A |
| 4,470,141 | A | * | 9/1984 | Takada | 370/324 |
| 4,737,788 | A | * | 4/1988 | Kennedy | 342/29 |
| 4,955,078 | A | * | 9/1990 | Chung | 455/244.1 |
| 7,095,289 | B2 | * | 8/2006 | Knoll et al. | 331/185 |
| 7,362,184 | B2 | * | 4/2008 | Feng et al. | 331/16 |
| 2004/0239354 | A1 | * | 12/2004 | Knoll et al. | 324/760 |

* cited by examiner

*Primary Examiner* — Hoai-An D Nguyen
(74) *Attorney, Agent, or Firm* — RatnerPrestia

(57) ABSTRACT

A device and a method for frequency analysis. The frequency of an output signal is divided, and an auxiliary signal with a known frequency is subtracted from the low-frequency signal to define a low-frequency differential signal. The output frequency is determined on the basis of the frequency of the low-frequency differential signal.

8 Claims, 2 Drawing Sheets

CIRCUIT ARRANGEMENT FOR FREQUENCY DETERMINATION

FIELD OF THE INVENTION

The invention relates to a device and a method for accurately determining a frequency. For example, it can be used in high-frequency, frequency-modulated radar sensors with voltage-controlled oscillators, where a look-up table is stored in the processor, which assigns a control voltage to each output frequency. For creating this look-up table, for example fixed control voltages are preset, and the output frequency is determined by way of a very accurate frequency measurement. Alternatively, the control voltage is varied until a specific frequency is reached. Other methods are also contemplated. The corresponding frequency/voltage pairs are then stored in the look-up table. In all cases, a very accurate frequency measurement is necessary.

BACKGROUND OF THE INVENTION

With reference to FIG. 1, it is the state of the art to divide a high-frequency output signal (f1) of an oscillator 1 by way of a frequency divider 2 to a lower terminal frequency, which can then be digitalised by means of known methods, e.g. mathematical methods such as counter, FFT etc., for example in a microcontroller uC. In the microcontroller uC, the look-up table is stored, with which the frequency of an oscillator 1 can then be controlled by way of a control voltage line. A schematic circuit design with a frequency source 1, a frequency divider 2 and a frequency analyser 4 of the lower frequency is shown in FIG. 1. An error of x % in the determination of the terminal frequency means an error of x % as well in the determination of the high frequency.

SUMMARY OF THE INVENTION

An object of the present invention is to determine a frequency at low cost and with a high level of accuracy.

In at least one embodiment, the present invention provides a circuit arrangement for frequency determination. The circuit arrangement includes an oscillator for generating an output signal (f1) and a frequency divider which divides the output signal (f1) and outputs an intermediate signal (f2). An auxiliary oscillator outputs an auxiliary signal (f0) and a frequency subtracter subtracts the auxiliary signal (f0) from the intermediate signal (f2) and thus generates a terminal signal (f3). Means are provided for frequency analysis of the terminal signal (f3) and for determining the frequency of the output signal (f1) on the basis of the frequency of the terminal signal (f3).

In at least one embodiment, the present invention provides a method for frequency determination, including the steps of supplying an output signal (f1) to a frequency divider which outputs the frequency-divided output signal as an intermediate signal (f2); subtracting an auxiliary signal (f0) from the intermediate signal (f2) and outputting a terminal signal (f3); and analyzing the frequency of the terminal signal (f3) and determining the frequency of the output signals (f1) therefrom.

BRIEF DESCRIPTION OF THE DRAWINGS

The invention is best understood from the following detailed description when read in connection with the accompanying drawings. Included in the drawings is the following figures.

DETAILED DESCRIPTION OF THE PREFERRED EMBODIMENTS

Figure 1:
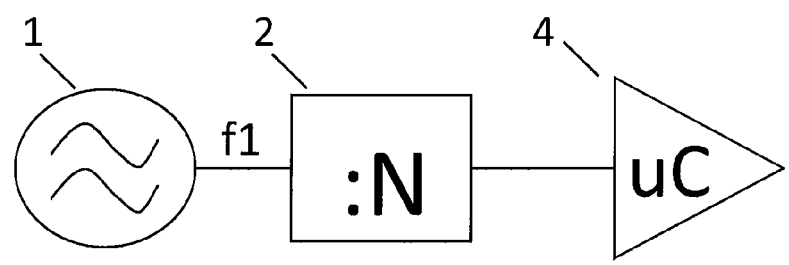
FIG. 1 is a schematic circuit design of a prior art system with a frequency source, a frequency divider and a frequency analyser.
Figure 2:
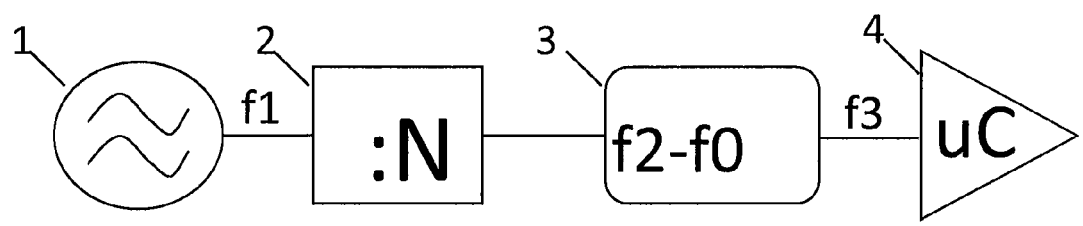
FIG. 2 is a schematic circuit diagram of an exemplary circuit arrangement for frequency determination in accordance with an embodiment of the invention.

Referring to FIG. 2, an exemplary circuit arrangement for frequency determination in accordance with an embodiment of the invention will be described. The high-frequency signal (f1) is at first divided to an intermediate frequency by division by the divisor N in the frequency divider 2, and the intermediate signal (f2) is put out. Then, an auxiliary signal (f0) is subtracted from the intermediate signal (f2) with a frequency subtracter 3, and the frequency is thus once again decreased. The low-frequency terminal signal (f3=f2−f0) is analysed with appropriate evaluation means 4, a microcontroller uC in the illustrated embodiment. From the frequency of the terminal signal (f3), the frequency of the high-frequency signal (f1) is determined by addition of the frequency of the auxiliary signal (f0) and multiplication by the divisor N of the frequency divider 2. In order to keep the costs of a frequency analysis low, preferably a subtracter with a divisor N>4 is used.

If the determination of the low-frequency output signal contains an error of x %, then the resulting error in the determination of the high frequency is y % with y<<x. In an exemplary implementation with $$f1 = 25000 \text{ MHz}$$
$$N = 2048$$
$$f0 = 12 \text{ MHz}$$

an error of 10% in the determination of the final frequency only leads to an error of 0.17 % in the determination of the high frequency f. This is an improvement of accuracy by the factor 59.

Figure 3:
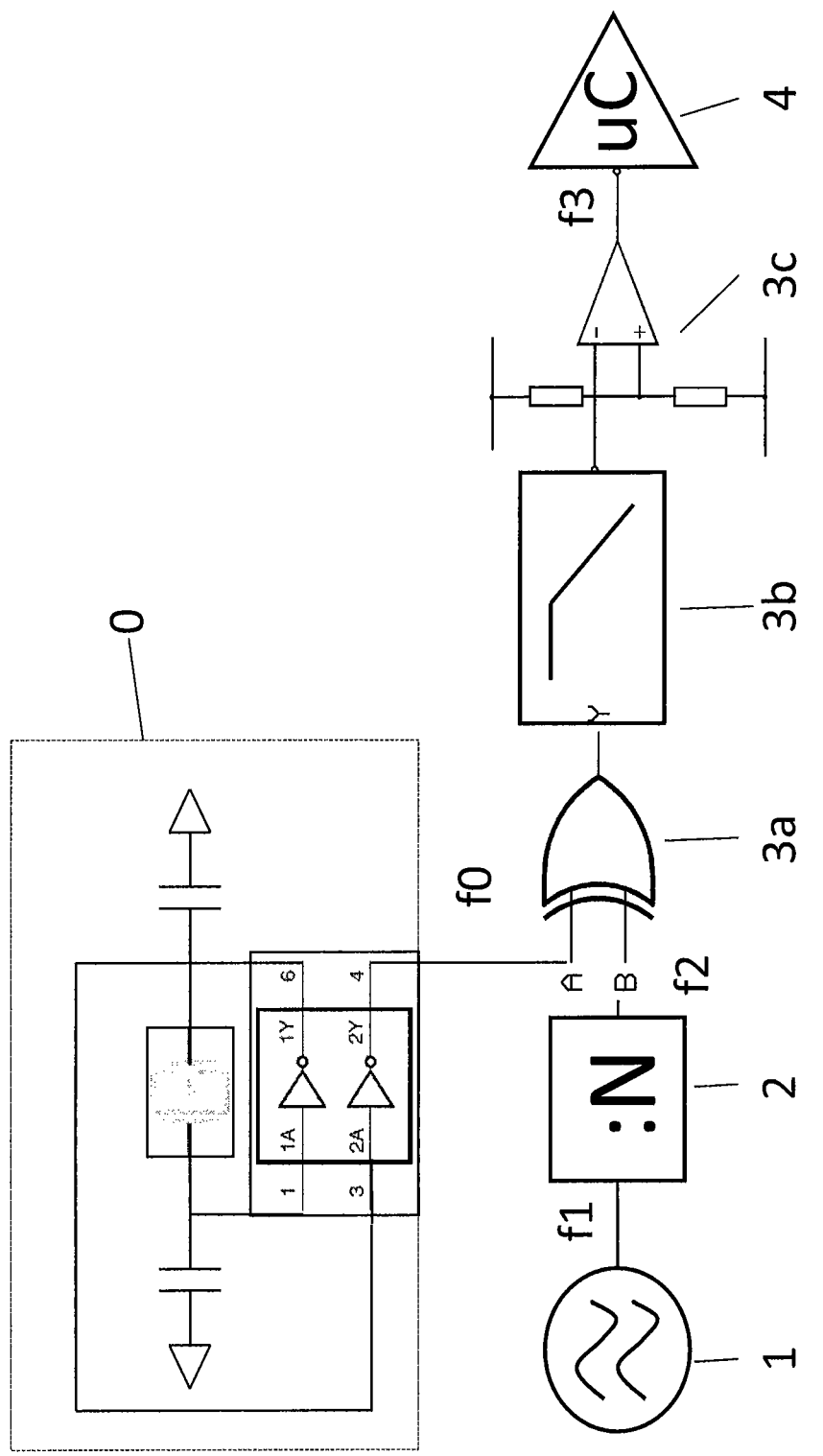
FIG. 3 is a schematic circuit diagram of an another exemplary circuit arrangement for frequency determination in accordance with another embodiment of the invention.

A preferred embodiment of the invention is shown in FIG. 3. The subtracter 3 is realized by a simple logical gate 3a, e.g. AND, XOR, . . . gate, with a downstream low-pass filter 3b. Therein, a special implementation is the use of a XOR gate 3a, as the XOR gate merely provides the sum of the two input frequencies as a by-product and no further by-products in addition to the desired difference of the two input frequencies. The undesirable sum of the two input frequencies can be removed at low cost by a downstream low-pass filter 3b. The reduction of the signal level can be compensated by using a comparator 3c or amplifier.

The auxiliary oscillator 0 is preferably formed by means of a simple inverter and a quartz crystal. One example is the Pierce oscillator, which uses a quartz crystal in parallel resonance and an inverter. The oscillation frequency of the circuit is substantially determined by the parallel resonance frequency of the quartz crystal and can still be slightly tuned by the two capacitances against ground. This arrangement is very low in costs and provides a very accurate auxiliary frequency f0. A further inverter can serve as buffer amplifier between auxiliary oscillator and subtracter. Ideally, a dual inverter is then used.

The invention claimed is:

1. A circuit arrangement for frequency determination comprising:
    an oscillator for generating an output signal (f1),
    a frequency divider which divides the output signal (f1) and outputs an intermediate signal (f2),
    an auxiliary oscillator which outputs an auxiliary signal (f0),
    a frequency subtracter which subtracts the auxiliary signal (f0) from the intermediate signal (f2) and thus generates a terminal signal (f3),
    means for frequency analysis of the terminal signal (f3),
    means for determining the frequency of the output signal (f1) on the basis of the frequency of the terminal signal (f3).

2. A circuit arrangement according to claim 1, wherein the frequency subtracter comprises a digital logical gate.

3. A circuit arrangement according to claim 2, wherein the gate is embodied as an XOR gate.

4. A circuit arrangement according to claim 2, wherein a low-pass filter is disposed downstream of the digital logical gate.

5. A circuit arrangement according to claim 4, wherein a comparator is disposed downstream of the low-pass filter.

6. A circuit arrangement according to claim 1, wherein the auxiliary oscillator comprises an inverter and a quartz crystal.

7. A circuit arrangement according to claim 6, wherein a further inverter is disposed as a buffer amplifier between the auxiliary oscillator and the subtracter.

8. A method for frequency determination, comprising the steps of:
    supplying an output signal (f1) to a frequency divider which outputs the frequency-divided output signal as an intermediate signal (f2);
    subtracting an auxiliary signal (f0) from the intermediate signal (f2) and outputting a terminal signal (f3); and
    analyzing the frequency of the terminal signal (f3) and determining the frequency of the output signals (f1) therefrom.

* * * * *